United States Patent
Higa et al.

(10) Patent No.: US 12,062,886 B2
(45) Date of Patent: Aug. 13, 2024

(54) OPTICAL FUNCTIONAL DEVICE AND LASER DEVICE

(71) Applicant: FURUKAWA ELECTRIC CO., LTD., Tokyo (JP)

(72) Inventors: Yasutaka Higa, Tokyo (JP); Yasumasa Kawakita, Tokyo (JP); Kazuaki Kiyota, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 253 days.

(21) Appl. No.: 17/392,899

(22) Filed: Aug. 3, 2021

(65) Prior Publication Data

US 2021/0367401 A1  Nov. 25, 2021

Related U.S. Application Data

(63) Continuation of application No. PCT/JP2020/004120, filed on Feb. 4, 2020.

(30) Foreign Application Priority Data

Feb. 6, 2019  (JP) .................................. 2019-019541

(51) Int. Cl.
*H01S 5/10* (2021.01)
*G02B 6/12* (2006.01)
(Continued)

(52) U.S. Cl.
CPC .......... *H01S 5/101* (2013.01); *G02B 6/12007* (2013.01); *G02B 6/29338* (2013.01);
(Continued)

(58) Field of Classification Search
CPC ............ G02B 6/12007; G02B 6/29338; G02B 6/29344; H01S 5/026; H01S 5/1007; H01S 5/101; H01S 5/12
See application file for complete search history.

(56) References Cited

U.S. PATENT DOCUMENTS 6,792,172 B1 * 9/2004 Levy .................... G02B 6/2813
385/39
9,164,349 B2 * 10/2015 Hayashi .................. G02F 1/225
(Continued)

FOREIGN PATENT DOCUMENTS

CN       105759357 A    7/2016
JP     2000-241644 A    9/2000
(Continued)

OTHER PUBLICATIONS

International Search Report issued Apr. 14, 2020 in PCT/JP2020/004120, filed on Feb. 4, 2020 citing documents AB-AG, AO-AV therein, 3 pages.
(Continued)

*Primary Examiner* — Daniel Petkovsek
(74) *Attorney, Agent, or Firm* — Oblon, McClelland, Maier & Neustadt, L.L.P.

(57) ABSTRACT

An optical functional device includes: first and second optical couplers each including a multi-mode interferometer waveguide portion having a first end portion and a second end portion, two units of first input/output ports and two units of second input/output ports; and first and second arc-shaped waveguides each optically connecting one of the first and second input/output ports of the first and second optical coupler and one of the first and second input/output ports of the second optical coupler, respectively. Further, the first optical coupler, the second optical coupler, the first arc-shaped waveguide, and the second arc-shaped waveguide constitute a ring resonator, and each of the multi-mode waveguide portions of the first optical coupler and the second optical coupler have a narrow portion, an average width of the narrow portion in a longitudinal direction being narrower than widths at the first end portion and the second end portion.

6 Claims, 5 Drawing Sheets

(51) Int. Cl.
  *G02B 6/293* (2006.01)
  *H01S 5/026* (2006.01)
  *H01S 5/12* (2021.01)

(52) U.S. Cl.
  CPC .......... *G02B 6/29344* (2013.01); *H01S 5/026* (2013.01); *H01S 5/12* (2013.01); *H01S 5/1007* (2013.01)

(56) References Cited

U.S. PATENT DOCUMENTS

| | | |
|---|---|---|
| 2003/0147432 A1 | 8/2003 | Bukkems |
| 2003/0235367 A1 | 12/2003 | Yamazaki |
| 2011/0229072 A1* | 9/2011 | Jeong .................. G02B 6/2813 385/28 |
| 2013/0209021 A1 | 8/2013 | Hayashi et al. |
| 2015/0207291 A1 | 7/2015 | Rickman et al. |
| 2018/0026426 A1 | 1/2018 | Kawakita et al. |

FOREIGN PATENT DOCUMENTS

| | | | |
|---|---|---|---|
| JP | 2002-514783 A | 5/2002 | |
| JP | 2003-337236 A | 11/2003 | |
| JP | 2006-284791 A | 10/2006 | |
| JP | 2008-66318 A | 3/2008 | |
| JP | 2011-197069 A | 10/2011 | |
| JP | 2013-93627 A | 5/2013 | |
| JP | 2013-168440 A | 8/2013 | |
| JP | 5458194 B2 * | 4/2014 | ............... H01S 5/14 |
| WO | WO 99/59012 | 11/1999 | |
| WO | WO 2016/152274 A1 | 9/2016 | |

OTHER PUBLICATIONS

Japanese Office Action dated Sep. 5, 2023 in Japanese Application No. 2020-571213 w/English machine translation, 7 pages.
Combined Chinese Office Action and Search Report issued Aug. 19, 2023 in Chinese Application 202080012607.5, (with unedited computer-generated English translation), citing documents 15-16 therein, 17 pages.

* cited by examiner

OPTICAL FUNCTIONAL DEVICE AND LASER DEVICE

CROSS-REFERENCE TO RELATED APPLICATION(S)

This application is a continuation of International Application No. PCT/JP2020/004120, filed on Feb. 4, 2020 which claims the benefit of priority of the prior Japanese Patent Application No. 2019-019541, filed on Feb. 6, 2019, the entire contents of which are incorporated herein by reference.

BACKGROUND

The present disclosure relates to an optical functional device and a laser device.

An optical functional device that has a ring resonator structure constituted of a semiconductor waveguide and the like has light transmission characteristics and light reflection characteristics that change periodically with respect to wavelength. Such an optical functional device is used as, for example, a wavelength selecting filter, or a reflector of a laser resonator in a wavelength-tunable laser device (for example, International Publication No. WO2016/152274). As an optical coupler of the ring resonator, for example, multi-mode interferometer (MMI) waveguide optical coupler is used.

SUMMARY

There is a need for providing an optical functional device and a laser device in which a flexibility in designing optical characteristics can be improved and an excess loss can be reduced.

According to an embodiment, an optical functional device includes: a multi-mode interferometer waveguide first optical coupler that includes a multi-mode interferometer waveguide portion having a first end portion and a second end portion that oppose to each other in a longitudinal direction, two units of first input/output ports that are arranged in a row at the first end portion in a width direction, and two units of second input/output ports that are arranged in a row at the second end portion in a width direction; a multi-mode interferometer waveguide second optical coupler that includes a multi-mode interferometer waveguide portion having a first end portion and a second end portion in a longitudinal direction, two units of first input/output ports that are arranged in a row at the first end portion in a width direction, and two units of second input/output ports that are arranged in a row at the second end portion in a width direction; a first arc-shaped waveguide that optically connects one of the first input/output ports of the first optical coupler and one of the first input/output ports of the second optical coupler; and a second arc-shaped waveguide that optically connects one of the second input/output ports of the first optical coupler and one of the second input/output ports of the second optical coupler. Further, the first optical coupler, the second optical coupler, the first arc-shaped waveguide, and the second arc-shaped waveguide constitute a ring resonator, and each of the multi-mode waveguide portions of the first optical coupler and the second optical coupler have a narrow portion, an average width of the narrow portion in a longitudinal direction being narrower than widths at the first end portion and the second end portion.

DETAILED DESCRIPTION

In the related art, the ring resonator designed using a publicly-known MMI waveguide has a problem that the flexibility in designing its optical characteristics, such as a free spectral range (FSR) or finesse, is low. Moreover, although the MMI waveguide theoretically lossless, an excess loss occurs due to dimension deviation and, therefore, to acquire a ring resonator with preferable characteristic, reduction of an excess loss in the MMI waveguide is also in demand.

Hereinafter, embodiments of the present disclosure will be explained in detail with reference to the accompanying drawings. Moreover, identical reference signs are assigned to identical or corresponding components throughout the drawings, and duplicated explanation will be appropriately omitted. Furthermore, it is necessary to be noted that the drawings are of schematic illustrations, and a relation among dimensions of respective components, ratio of the respective components, and the like can differ from an actual situation.

First Embodiment

Figure 1:
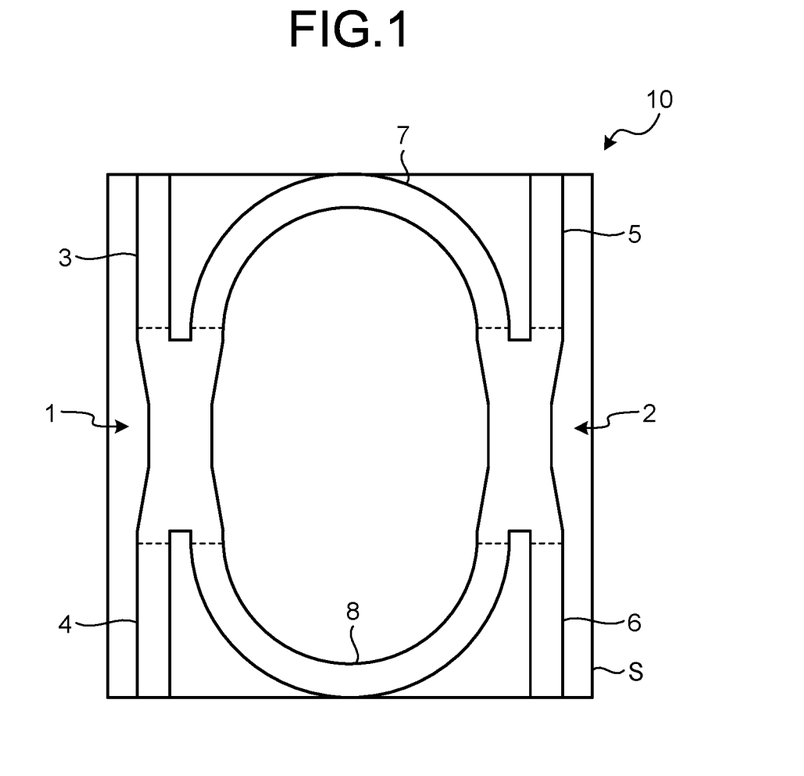
FIG. 1 is a schematic diagram of an optical functional device according to a first embodiment.

FIG. 1 is a schematic diagram of an optical functional device according to a first embodiment. This optical functional device 10 includes waveguides formed on a substrate S as follows: an optical coupler 1 that is a first optical coupler, a second optical coupler 2 that is a second optical coupler, light input/output waveguides 3, 4, 5, 6, an arc-shaped waveguide 7 that is a first arc-shaped waveguide, and an arc-shaped waveguide 8 that is a second arc-shaped waveguide.

The optical couplers 1, 2 are 2×2 MMI waveguide optical couplers. The arc-shaped waveguide 7 is optically connected to one of input/output ports of the optical coupler 1, and to one of input/output ports of the optical coupler 2. To the other two input/output ports of the optical coupler 1, the light input/output waveguides 5, 6 are optically connected. To the other two input/output ports of the optical coupler 2, the light input/output waveguides 5, 6 are optically connected.

Specifically, the arc-shaped waveguide 7 and the arc-shaped waveguide 8 are respectively connected to input/output ports opposing to each other in a longitudinal direction of the optical coupler 1. Similarly, the arc-shaped waveguide 7 and the arc-shaped waveguide 8 are respectively connected to input/output ports opposing to each other in a longitudinal direction of the optical coupler 2. Moreover, the light input/output waveguides 3, 4 are respectively connected to input/output ports opposing to each other in the longitudinal direction of the optical coupler 1. Similarly, the light input/output waveguides 5, 6 are respectively connected to input/output ports opposing to each other in the longitudinal direction of the optical coupler 2.

Thus, the optical couplers 1, 2, the arc-shaped waveguides 7, 8 constitute a ring resonator. Moreover, the light input/output waveguides 3, 4, 5, 6 have a function of inputting and outputting light to this ring resonator.

These waveguides have, for example, a waveguide structure in which an optical waveguide layer made from a semiconductor material, such as InGaAsP, having a refractive index higher than that of InP in a cladding region made from InP, and has, for example, a high mesa waveguide structure. Note that InP and InGaAsP are used because the optical functional device 10 functions preferably with respect to light of a 1.55 μm wavelength band. When light of another wavelength band is guided, a semiconductor material suitable for the wavelength may be used.

Figure 2A:
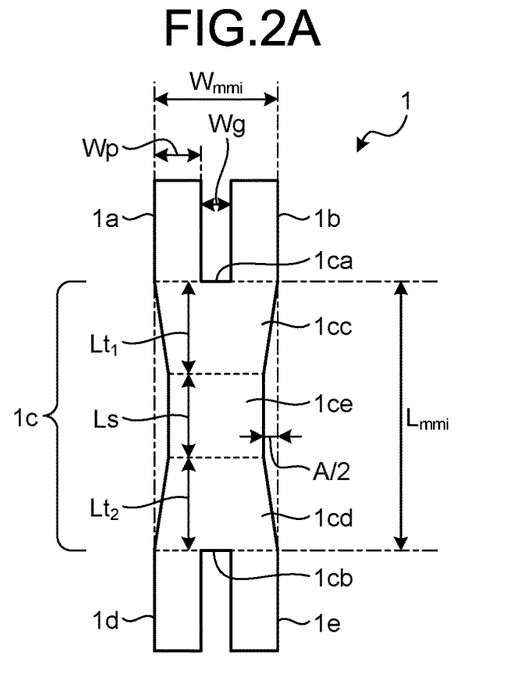
FIG. 2A is a schematic diagram of an optical coupler illustrated in FIG. 1.
Figure 2B:
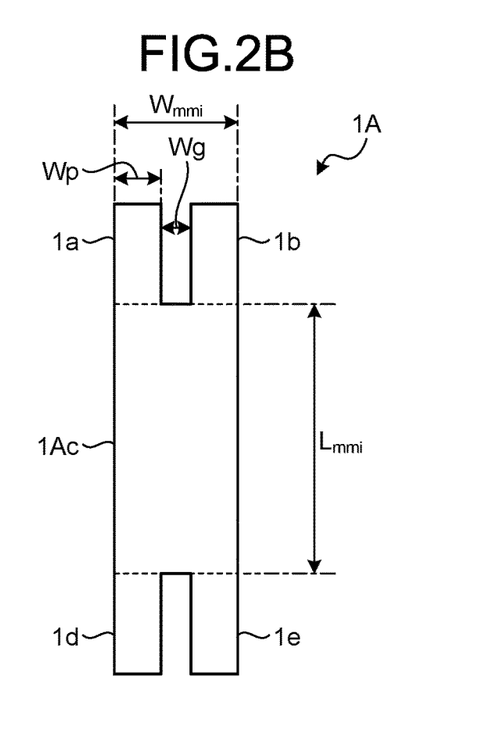
FIG. 2B is a schematic diagram of an optical coupler of a comparative embodiment.

Next, a specific configuration of the optical coupler 1 will be explained. Because the optical coupler 2 has substantially the same configuration as the optical coupler 1, explanation thereof will be omitted. Moreover, in the following, the specific configuration of the optical coupler 1 will be explained by comparing with an optical coupler of a comparative embodiment. FIG. 2A is a schematic diagram of the optical coupler 1 and FIG. 2B is a schematic diagram of an optical coupler 1A of a comparative embodiment.

The optical coupler 1 includes two input/output ports 1a, 1b that are first input/output ports, a MMI waveguide portion 1c, and two input/output ports 1d, 1e that are second input/output ports. The MMI waveguide portion 1c has end portions 1ca, 1cb that are a first end portion and a second end portion that oppose to each other in a longitudinal direction. The input/output ports 1a, 1b are arranged in a row in a width direction of the MMI waveguide portion 1c at the end portion 1ca. The input/output ports 1d, 1e are arranged parallel to the width direction of the MMI waveguide portion 1c. A longitudinal direction of the MMI waveguide portion 1c is an up and down direction of the drawing, and the width direction is a left and right direction of the drawing perpendicular to the longitudinal direction.

For example, when light of a predetermined wavelength is input in a single mode from the input/output port 1a, the light inputs to the MMI waveguide portion 1c from the end portion 1ca to be branched into multiple modes to be guided, and interfere with one another while being guided. Consequently, the guided light forms an image at a predetermined branching ratio and in the single mode at a position at which it is connected to each of the input/output ports 1d, 1e of the end portion 1cb. Consequently, the input light is branched at the predetermined branching ratio to be output from the input/output ports 1d, 1e. Although a case in which light is input from the input/output port 1a, and light is output from the input/output ports 1d, 1e is explained herein, it may be configured to input light form one of the input/output ports 1d, 1e, and to output light from the input/output ports 1a, 1b.

The MMI waveguide portion 1c is constituted of tapered portions 1cc, 1cd, and a fixed-width portion ice. The tapered portion 1cc is positioned on a side of the input/output ports 1a, 1b, and the width continuously decreases toward the input/output ports 1d, 1e in the longitudinal direction of the MMI waveguide portion 1c. The tapered portion 1cc has a isosceles trapezoid shape when viewed from top as illustrated in FIG. 2A.

The fixed-width portion 1ce is positioned adjacent to the input/output ports 1d, 1e of the tapered portion 1cc. The width of the fixed-width portion 1ce is substantially constant in the longitudinal direction, and is substantially the same as the width of the tapered portion 1cc on a side on which the input/output ports 1d, 1e are positioned. The fixed-width portion 1ce has a rectangular shape when viewed from top as illustrated in FIG. 2A.

The tapered portion 1cd is positioned on a side on which the input/output ports 1d, 1e of the fixed-width portion 1ce are positioned, and the width thereof continuously increases toward the side on which the input/output ports 1d, 1e are positioned in the longitudinal direction of the MMI waveguide portion 1c. The width of the tapered portion 1cd of the side on which the input/output ports 1a, 1b are positioned is substantially the same as the width of the fixed-width portion 1ce. Moreover, the width of the tapered portion 1cd on the side on which the input/output ports 1d, 1e are positioned (the width at the end portion 1cb) is substantially the same as the switch of the tapered portion 1cc on the side on which the input/output ports 1a, 1b are positioned (the width at the end portion 1ca). The tapered portion 1cd has a isosceles trapezoid shape when viewed from top as illustrated in FIG. 2A.

The tapered portions 1cc, 1cd, the fixed-width portion 1ce are all narrow width portions in which an average width in the longitudinal direction is narrower than the width of the end portions 1ca, 1cb.

Suppose that the length of the MMI waveguide portion 1c is $L_{mmi}$, the widths at the end portions 1ca, 1cb are $W_{mmi}$, the widths of the input/output ports 1a, 1b, 1d, 1e are all Wp, and a gap between the input/output ports 1a and 1b and a gap between the input/output ports 1d and 1e are both Wg. Moreover, suppose that the length of the tapered portions 1cc, 1cd, the length of the fixed-width portion 1ce are Lt1, Lt2, Ls, respectively. Furthermore, suppose that a difference between $W_{mmi}$ and the width of the fixed-width portion 1ce is A. Because the tapered portions 1cc, 1cd have a isosceles trapezoid shape, each of ends in the width direction of the fixed-width portion 1ce is positioned at a position of A/2 from either one of the ends in the width direction of the end portions 1ca, 1cb. The width of the fixed-width portion 1ce is $(W_{mmi}-A)$, and the average width in the longitudinal direction of the tapered portions 1cc, 1cd is $(W_{mmi}-A/2)$.

The width $(W_{mmi}-A)$ of the fixed-width portion 1ce is, for example, equal to or larger than 25% and smaller than 100% of $W_{mmi}$. Moreover, the length Ls of the fixed-width portion 1ce is, for example, a value equal to or larger than 10% of $L_{mmi}$, and a value smaller than 100%.

Arranging such a narrow portion in the MMI waveguide portion 1c, the optical functional device 10 is to be highly flexible in designing the optical characteristics, and an excess loss thereof is reduced therein.

Hereinafter, explanation will be given by comparing with the optical coupler 1A according to the comparative embodiment of FIG. 2B. The optical coupler 1A has the configuration of the optical coupler 1 in which the MMI waveguide portion 1c is replaced with an MMI waveguide portion 1Ac. The MMI waveguide portion 1Ac is a waveguide in a rectangular shape when viewed from top. Similarly to the optical coupler 1, suppose that a length of the MMI waveguide portion 1Ac is $L_{mmi}$, and a width thereof is $W_{mmi}$.

The branching ratio of the optical couplers 1, 1A is defined, for example, by a ratio of a power of light branched to be output from the input/output port 1e, to a power of input light when light is input from the input/output port 1a. When the branching ratio of the optical coupler 1A is 50%, following equation holds. Note that n is an effective refractive index of the MMI waveguide portion 1Ac, and λ is a wavelength of input light.

$$L_{mmi} = \frac{3}{2} \cdot \frac{4n}{3\lambda} W_{mmi}^2$$

Because a relationship between $L_{mmi}$ and $W_{mmi}$ is uniquely determined as described, and because FSR and or finesse are also determined by this relationship in the optical coupler 1A, the flexibility in designing optical characteristics is low. The finesse is an amount defined by a ratio of FSR with respect to a transmission peak or a full width at half maximum of a reflection peak when there are the optical transmission characteristics or the optical reflection characteristics that vary periodically with respect to a wavelength. As the finesse increases the transmission peak or the reflection peak become more acute and, for example, the wavelength selectivity increases.

On the other hand, by arranging the narrow portion in the MMI waveguide portion 1c in the optical coupler 1, the flexibility in designing optical characteristics can be increased by setting the length and width of the narrow portion. As a result, the flexibility in designing the optical characteristics of the optical functional device 1—having the optical couplers 1, 2 can be increased.

An effect of the narrow portion will be explained, referring to a result obtained by performing a beam propagation method (BPM) analysis. In the following, the analysis has been performed while changing combinations of $L_{mmi}$ and A variously, setting $W_{mmi}$ to 3.15 μm, Wp to 1.2 μm, Wg to 0.75 μm, and both Lt1 and Lt2 to 10 μm.

Figure 3:
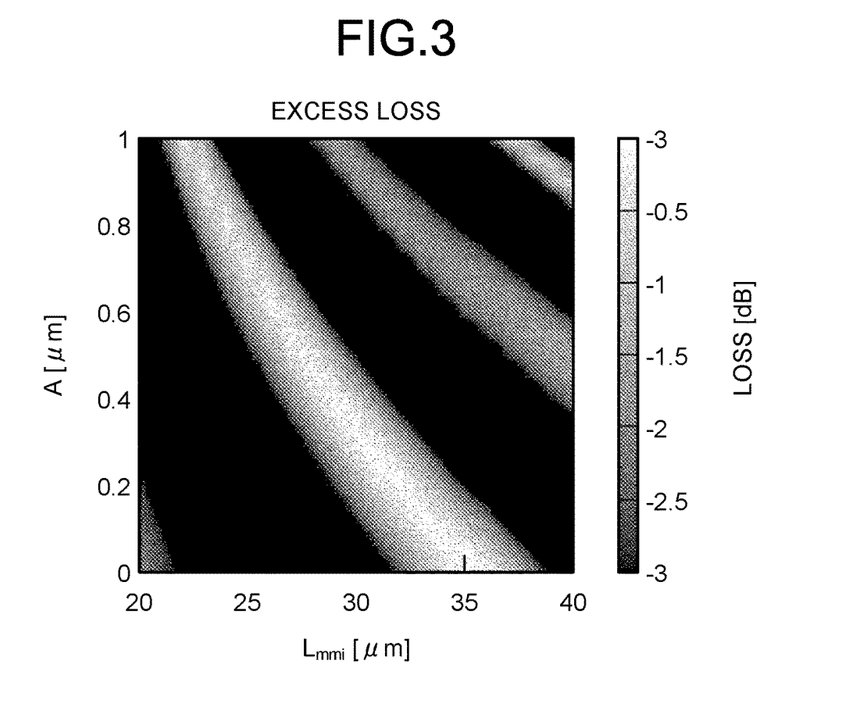
FIG. 3 is a diagram illustrating an example of excess loss characteristics.

FIG. 3 is a diagram illustrating an example of excess loss characteristics. The excess loss is a total power of output light to a power of input light expressed in units of dB, when light is input from the input/output port 1a, and branched lights are respectively output from the input/output ports 1d and 1e.

In FIG. 3, A=0 corresponds to characteristics of the optical coupler 1A of the comparative embodiment. Form FIG. 3, it can be found that by appropriately selecting a combination of $L_{mmi}$ and A, the excess loss can be reduced more than the optical coupler 1A. Particularly, it can be found that if A is decreased as $L_{mmi}$ is decreased, the MMI waveguide portion 1c can be shortened in the longitudinal direction while maintaining the excess loss low, and the optical coupler 1 can be downsized.

Figure 4:
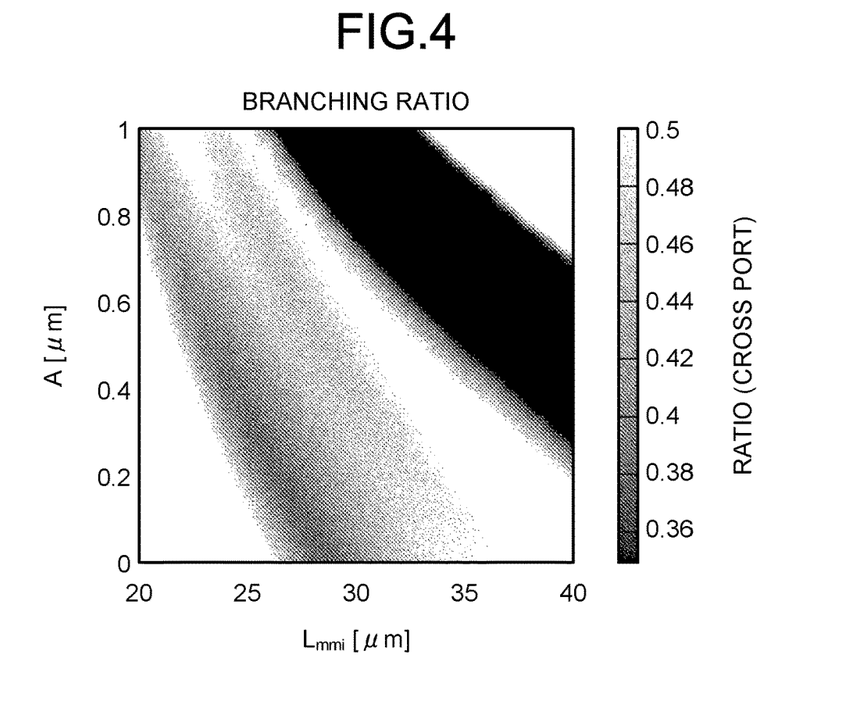
FIG. 4 is a diagram illustrating an example of characteristics of branching ratio.

Next, FIG. 4 is a diagram illustrating an example of characteristics of a branching ratio. Ratio (cross port) signifies a branching ratio, and is a ratio of power of light that is branched and output from the input/output port 1e to a power of input light, for example, when light is input from the input/output port 1a.

In FIG. 4, A=0 corresponds to characteristics of the optical coupler 1A of the comparative embodiment. From FIG. 3 and FIG. 4, it can be found that the MMI waveguide portion 1c can be shortened in the longitudinal direction while maintaining the branching ratio uniform, and maintaining the excess loss low, and the optical coupler 1 can be downsized.

From the above, in the optical coupler 1, it is possible to hold following equation while setting the branching ratio to other than 50%, that is, larger than 0% and smaller than 50%, or larger than 50% and smaller than 100%. Note that n is an effective refractive index of the MMI waveguide portion 1c, and λ is a wavelength of input light.

$$L_{mmi} < \frac{3}{2} \cdot \frac{4n}{3\lambda} W_{mmi}^2$$

Because the optical coupler 1 and the optical coupler 2 can thus be downsized, the optical functional device 10 can also be downsized.

Next, optical characteristics of the optical functional device 10 will be explained, referring to a result obtained by using the BPM analysis. First, in the optical functional device 10, the combination of A and $L_{mmi}$ was set such that the branching ratio of the optical couplers 1, 2 is to be 40% for a cross port at a predetermined wavelength based on the BPM analysis result of the optical coupler 1. Subsequently, characteristics of the optical functional device 10 as a reflective device were analyzed. Specifically, light of a predetermined wavelength is input from the light input/output waveguide 4 of the optical functional device 10, and a power of light output from the light input/output waveguide 6 was analyzed. A ratio of the power of the input light to a power of the output light was calculated as a standardized reflection port power.

Figure 5:
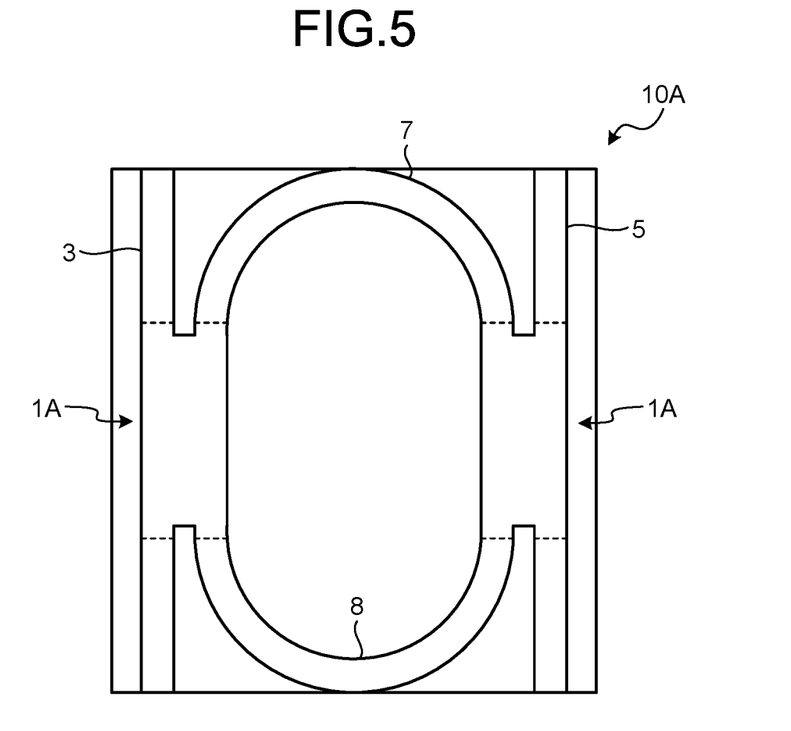
FIG. 5 is a schematic diagram of an optical functional device according to a comparative embodiment.

Moreover, characteristics of an optical functional device 10A having a configuration illustrated in FIG. 5 were analyzed. The optical functional device 10A has the configuration of the optical functional device 10 in which the optical couplers 1, 2 are replaced with the optical coupler 1A, the branching ratio of which is 50%. Light is input from the light input/output waveguide 4 of the optical functional device 10A, and a power of light output from the light input/output waveguide 6 was analyzed, to calculate the standardized reflection port power. Note that radiuses of the arc-shaped waveguides 7, 8 were adjusted respectively in the optical functional device 10A and the optical functional device 10 such that the optical functional device 10A and the optical functional device 10 have the same FSR.

Figure 6:
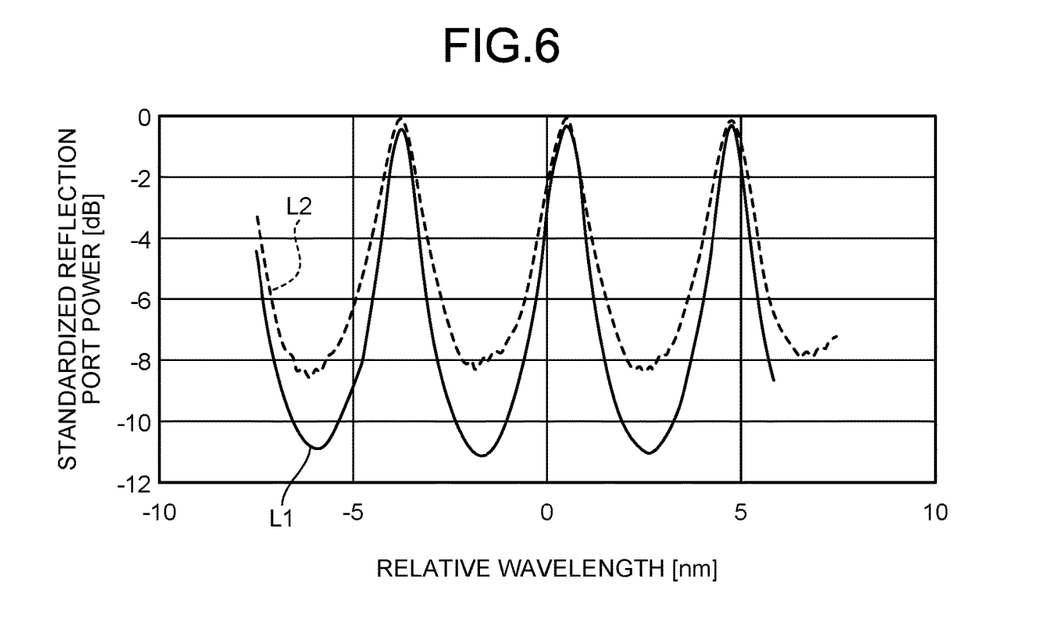
FIG. 6 is a diagram illustrating an example of characteristics of standardized reflection port power.

FIG. 6 is a diagram illustrating an example of a characteristic of the standardized reflection port power. A horizontal axis is for a relative wavelength based on a predetermined wavelength of 1.55 μm band, and a vertical axis for a standardized reflection port power expressed in units of dB. A solid line L1 is the reflection characteristics of the optical functional device 10, and a broken line L2 is the reflection characteristics of the optical functional device 10A. As shown in FIG. 6, it was found that the finesse can be higher in the optical functional device 10 than in the optical functional device 10A. Moreover, in the optical functional device 10, by making the branching ratio larger than 50%, the finesse can be lower than the optical functional device 10A.

As explained above, the optical functional device 10 according to the first embodiment is highly flexible in designing optical characteristics, such as FSR and finesse, and an excess loss can be reduced therein.

Second Embodiment

Figure 7:
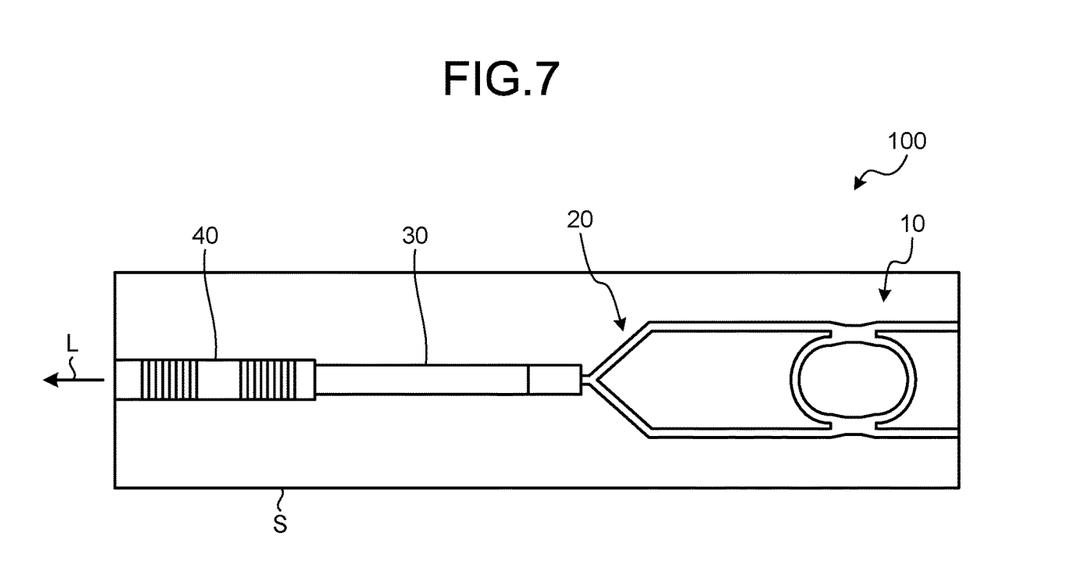
FIG. 7 is a schematic diagram of a laser device according to a second embodiment.

FIG. 7 is a schematic diagram of a laser device according to a second embodiment. This laser device 100 is configured as a wavelength-tunable laser device that uses the vernier effect as the one disclosed in International Publication No. WO2016/152274. The laser device 100 includes optical functional devices 10, 20, 30, 40 integrated on the common substrate S. Note that illustration of wiring and electrode pads to supply an electric current to respective heaters and electrodes described later is omitted in FIG. 7.

The optical functional device 10 has the configuration illustrated in FIG. 1, and further includes a heater to heat the ring resonator. The optical functional device 20 is a 1×2 MMI waveguide optical coupler, and arm portions that extend respectively from two ports are optically connected to the optical functional device 10, and 1 port is optically connected to the optical functional device 30. When light is input to 1 port of the optical functional device 20, the light is reflected by a function of the optical functional devices 10, 20, to be output from 1 port of the optical functional device 20. At this time, the optical functional devices 10, 20 have reflection spectral characteristics that has a comb-shaped peak. Thus, the optical functional devices 10, 20 constitutes one of reflectors of the laser resonator. By heating an optical waveguide layer in the ring resonator of the optical functional device 10 with a heater, a reflection peak wavelength can be entirely shifted on a wavelength axis.

Moreover, a heater is arranged at a portion of the arm portion of the optical functional device 20. By heating an optical waveguide layer in the arm portion, an optical path length of the optical waveguide layer can be changed. Thus, a resonator length of the laser resonator can be changed.

The optical functional device 30 has a semiconductor layer structure including an active layer. The active layer is optically connected to 1 port of the optical functional device 20, and to the optical functional device 40. The active layer is supplied with an electric current by an electrode arranged in the optical functional device 30, and generates light gain.

The optical functional device 40 has a semiconductor layer structure that includes a distributed Bragg reflector (DBR) diffraction grating layer including a sampled grating, and an optical waveguide layer.

This optical functional device 40 has reflection spectral characteristics having a comb-shaped peak, a cycle of which differs from that of the optical functional devices 10, 20, and constitutes the other one of the reflectors of the laser resonator. By heating the diffraction grating of the optical functional device 40 with a heater, a reflection peak wavelength can be entirely shifted on a wavelength axis.

The laser device 100 functions as a wavelength-tunable laser device that uses the vernier effect by adjusting an electric current to be supplied to the heater or the electrode.

In the configuration of the laser device 100, the optical functional device 40 as a reflector may be replace with a reflector constituted of the optical functional device 10 and the optical functional device 20. In the laser device thus configured, two reflectors constituted of the optical functional device 10 and the optical functional device 20 constitute a laser resonator. In this case, it is necessary to vary cycles of comb-shaped reflection peaks of the two reflectors from each other.

Moreover, the optical functional device 10 may be combined with a reflection mirror, to constitute a reflector having a comb-shaped reflection peak. Such a reflector can be used as a reflector of a laser resonator. Furthermore, the optical functional device 10 can be used as a wavelength selecting filter.

While the width of the tapered portion varies continuously and linearly in the longitudinal direction in the above embodiments, it may vary continuously and curvilinearly, or may vary in multiple steps.

Moreover, although the first optical coupler and the second optical coupler have substantially the same configuration in the above embodiments, the configurations may be different from each other.

Furthermore, although the MMI waveguide portion is constituted only of plural narrow portions in the above embodiments, the MMI waveguide portion may include a portion that is not a narrow portion. For example, the MMI waveguide portion may include a fixed-width portion having a width substantially the same as the width at the end portion of the MMI waveguide portion.

According to an embodiment, an effect that the flexibility in designing optical characteristics can be improved and an excess loss can be reduced is produced.

The optical functional device according to an embodiment can be applied to an reflector of a laser oscillator in a wavelength-variable laser device, and the laser device according to an embodiment can be applied to a wavelength-variable light source used in optical communications and the like.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical functional device comprising:
a multi-mode interferometer waveguide first optical coupler that includes a multi-mode interferometer waveguide portion having a first end portion and a second end portion that oppose to each other in a longitudinal direction, two units of first input/output ports that are arranged in a row at the first end portion in a width direction, and two units of second input/output ports that are arranged in a row at the second end portion in a width direction;
a multi-mode interferometer waveguide second optical coupler that includes a multi-mode interferometer waveguide portion having a first end portion and a second end portion in a longitudinal direction, two units of first input/output ports that are arranged in a row at the first end portion in a width direction, and two units of second input/output ports that are arranged in a row at the second end portion in a width direction;
a first arc-shaped waveguide that optically connects one of the first input/output ports of the first optical coupler and one of the first input/output ports of the second optical coupler; and
a second arc-shaped waveguide that optically connects one of the second input/output ports of the first optical coupler and one of the second input/output ports of the second optical coupler, wherein
the first optical coupler, the second optical coupler, the first arc-shaped waveguide, and the second arc-shaped waveguide constitute a ring resonator,
each of the multi-mode waveguide portions of the first optical coupler and the second optical coupler have a narrow portion, an average width of the narrow portion in a longitudinal direction being narrower than widths at the first end portion and the second end portion,
each of the narrow portions includes a fixed width portion which has a substantially constant width in the longitudinal direction,
when a length of the multi-mode interferometer waveguide portion of any one of the first optical coupler and the second optical coupler is $L_{mmi}$, a width of any one of the first end portion and the second end portion of the multi-mode interferometer waveguide portion is $W_{mmi}$, and a difference between $W_{mmi}$ and the width of the fixed-width portion is A, A is decreased as $L_{mmi}$ is decreased such that low excess loss is maintained, the width of the fixed-width portion(s) is equal to or larger than 25%, and smaller than 100%, of the width of any one of the first end portion and the second end portion, a part of the first end portion where the first input/output ports do not exist is located within a range of the width of each of the narrow portions, and a part of the second end portion where the second input/output ports do not exist is located within a range of the width of each of the narrow portions.

2. The optical functional device according to claim 1, wherein an effective refractive index of the multi-mode interferometer waveguide portion is n, a following equation holds at a wavelength λ

$$L_{mmi} < \frac{3}{2} \cdot \frac{4n}{3\lambda} W_{mmi}^2.$$

3. The optical functional device according to claim 1, wherein a branching ratio of the first optical coupler and the second optical coupler is larger than 0% and smaller than 50%, or larger than 50% and smaller than 100%.

4. The optical functional device according to claim 1, wherein the width of the narrow portion(s) varies in the longitudinal direction continuously or in multiple steps.

5. The optical functional device according to claim 1, wherein a length of the fixed-width portion(s) is equal to or larger than 10% of a respective length of the multi-mode interferometer waveguide portion(s).

6. A laser device that include the optical functional device according to claim 1.

* * * * *